US012587148B2

(12) United States Patent
Helm

(10) Patent No.: US 12,587,148 B2
(45) Date of Patent: Mar. 24, 2026

(54) AUTOMATIC RF OUTPUT POWER-LIMITING AMPLIFIER WITH DYNAMIC FEEDBACK

(71) Applicant: Raytheon Company, Waltham, MA (US)

(72) Inventor: Brian P. Helm, Murphy, TX (US)

(73) Assignee: RAYTHEON COMPANY, Waltham, MA (US)

( * ) Notice: Subject to any disclaimer, the term of this patent is extended or adjusted under 35 U.S.C. 154(b) by 547 days.

(21) Appl. No.: 18/160,581

(22) Filed: Jan. 27, 2023

(65) Prior Publication Data

US 2024/0258976 A1    Aug. 1, 2024

(51) Int. Cl.
H03F 3/193 (2006.01)
H03F 1/56 (2006.01)
H03G 1/00 (2006.01)
H03G 3/30 (2006.01)

(52) U.S. Cl.
CPC ............... H03F 3/193 (2013.01); H03F 1/56 (2013.01); H03G 1/0088 (2013.01); H03G 3/3036 (2013.01); H03F 2200/255 (2013.01); H03F 2200/451 (2013.01)

(58) Field of Classification Search
CPC ...... H03F 3/193; H03F 1/56; H03F 2200/255; H03F 2200/451; H03G 1/0088; H03G 3/3036
USPC .................................................. 330/277, 302
See application file for complete search history.

(56) References Cited

U.S. PATENT DOCUMENTS 7,755,222 B2    7/2010   Heston et al.

*Primary Examiner* — Andrea Lindgren Baltzell
*Assistant Examiner* — Nareh Shamiryan
(74) *Attorney, Agent, or Firm* — CANTOR COLBURN LLP

(57) ABSTRACT

An amplifier includes a gain stage having a gain stage input and a gain stage output and an impedance matching circuit connected to the gain stage output, the impedance matching circuit including an input and an output. The amplifier also includes a coupling circuit connected to the input of the impedance matching circuit and a shorting circuit connected to the output of the impedance matching circuit. The coupling circuit provides a voltage to the shorting circuit that causes the shorting circuit create a short to ground through a reflecting capacitor which causes a reflection to be provided to the output of the impedance matching circuit and that is transmitted to the coupling circuit to increase the voltage provided to the shorting circuit by the coupling circuit.

13 Claims, 4 Drawing Sheets

AUTOMATIC RF OUTPUT POWER-LIMITING AMPLIFIER WITH DYNAMIC FEEDBACK

BACKGROUND

The present disclosure relates to controlling low noise amplifiers (LNA) and, in particular, to automatic radio frequency (RF) power limiting for LNA and LNAs that are power-limited.

Typical RF systems include an antenna that receives an RF signal. That signal is then amplified and provided to processing circuitry such as a digital signal processor (DSP). The gain of the amplifier is preferably high and linear over the range of expected inputs. A draw back of such a situation, however, is that high amplifier output can in times of high input signals can produce high output signals that may damage the low power processing circuitry (e.g., the DSP).

To address the possibilities of over-powering the low power processing circuitry, one approach is to insert a circuitry between the amplifier circuits and the low power processing circuitry. Such a solution can, however, increase system noise, be complex, or increase cost.

SUMMARY

Disclosed herein is amplifier that includes a gain stage having a gain stage input and a gain stage output and an impedance matching circuit connected to the gain stage output, the impedance matching circuit including an input and an output. The amplifier also includes a coupling circuit connected to the input of the impedance matching circuit and a shorting circuit connected to the output of the impedance matching circuit. In this embodiment, the coupling circuit provides a voltage to the shorting circuit that causes the shorting circuit create a short to ground through a reflecting capacitor which causes a reflection to be provided to the output of the impedance matching circuit and that is transmitted to the coupling circuit to increase the voltage provided to the shorting circuit by the coupling circuit.

According to any prior embodiment, the coupling circuit can include a coupling capacitor connected to the gain stage output.

According to any prior embodiment, the coupling circuit can include a storage capacitor connected between the coupling capacitor and ground that store power coupled from the output of the gain stage output by the coupling capacitor.

According to any prior embodiment, the coupling circuit can include a diode connected between the coupling capacitor the storage capacitor such that charge flows from the coupling capacitor to the storage capacitor.

According to any prior embodiment, the amplifier can include a first resistor connected between an output of the coupling circuit and the shorting circuit.

According to any prior embodiment, the shorting circuit can include a transistor having a gate connected to between an output of the coupling circuit such that the voltage provided by the shorting circuit controls operation of the transistor.

According to any prior embodiment, the shorting circuit can include a reflecting capacitor connected to the transistor and the transistor controls if power is provided to the reflecting capacitor. In one embodiment, the reflecting capacitor is connected between the output of the impedance matching circuit and the transistor. In one embodiment, the transistor is connected between the output of the impedance matching circuit and the reflecting capacitor.

According to any prior embodiment, the coupling circuit can include a second resistor connected in parallel with the diode.

According to any prior embodiment, the coupling circuit can include a third resistor connected in parallel with the storage capacitor.

According to any prior embodiment, the coupling circuit can operate as a charge pump.

According to any prior embodiment, the impedance matching circuit can transform a short circuit created through a reflection capacitor in shorting circuit connected to the output of the into an open circuit at the input.

Additional features and advantages are realized through the techniques of the present disclosure. Other embodiments and aspects are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
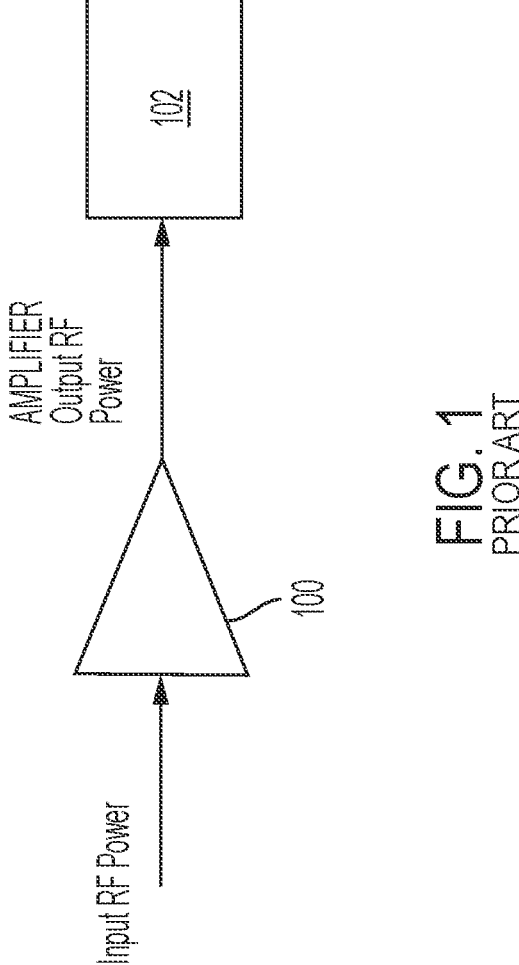
FIG. 1 is a simplified view of an amplifier connected to a low power (e.g., DSP) circuit.

As previously noted, and as shown in FIG. 1, input RF power is typically received by amplifier 100 and provided to a low power circuit 102 such as a DSP. With reference to both FIGS. 1 and 2, the amplifier 100 receives an RF input having an RF input power. The input power is shown on the X axis for FIG. 2. The amplifier creates output having an amplifier output power which is shown in on the Y axis of FIG. 2. The relationship of the two for the amplifier 100 is shown by trace 200.

Figure 2:
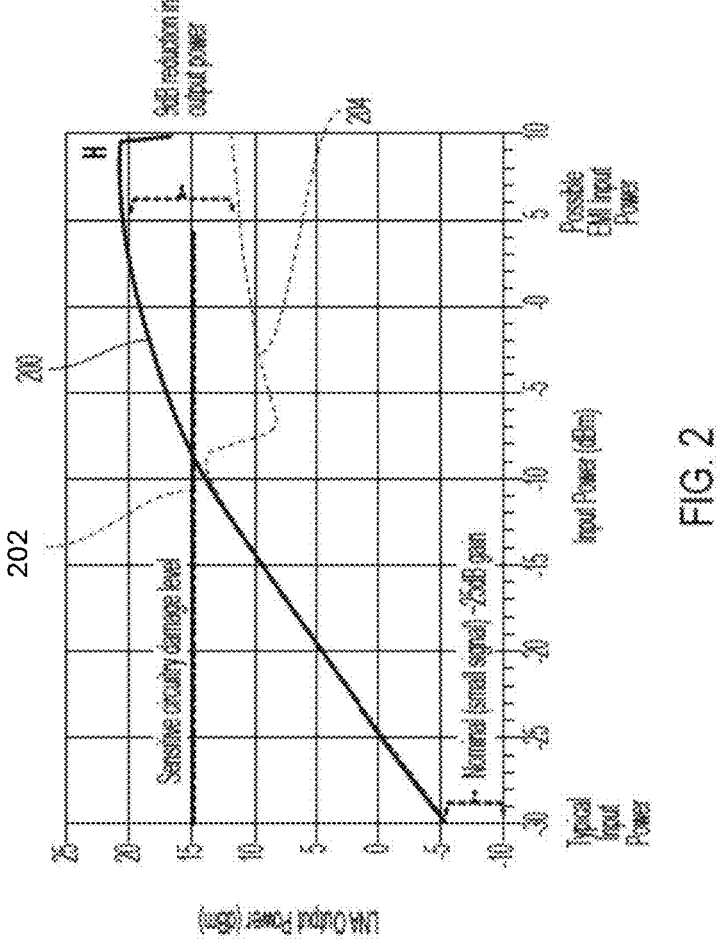
FIG. 2 is graph plotting amplifier input vs output of the amplifier of FIG. 1 compared to the output of the amplifier that includes an RF power limiting circuit according to one or more embodiments.

FIG. 2 also shows a possible damage level 202 at which power output from the amplifier 100 may damage the low power circuit 102. Thus, while linearity of the amplifier 100 is desired, it can lead to overpowering the low power circuit 102.

One method of limiting this power can include insert attenuator between the amplifier 100 and the low power circuit 102. This, however, can increase system noise figure. Another approach is to insert a switchable attenuator between the amplifier 100 and the low power circuit 102. Such a circuit may be complex and must sense the power and switch the attenuator quickly. Yet another method can include inserting a diode limiter between the amplifier 100 and the low power circuit 102 but this can add circuit complexity and cost. Another possible solution the inventors contemplate is to utilized charge pumps to limit the RF input power for self-protection, however, this implementation focuses on using self-generated RF power to reflect back and changes the inherent performance of the amplifier (e.g., can reduce linearity).

According to one embodiment, an amplifier that may be linear and limited so that it does not over-power a connected circuit is provided. The amplifier can be a monolithic microwave/millimeter-wave integrated circuit (MMIC) amplifier in one embodiment. The amplifier includes a gain stage and an output limiter. The output limiter includes, in one embodiment, an RF coupling circuit and an output shorting circuit. In operation, the RF coupling circuit controls the operation of the output shorting circuit to limit the output power under high RF drive conditions. The shorted output reflects back to enhance the RF coupling circuit and create a self-limiting amplifier to protect sensitive back-end components (e.g., the above discussed DSP or other sensitive circuits) from RF power damage. With reference to FIG. 2 again, the output 204 of an example embodiment of the amplifier is shown. The output limiter limits the output so that is does not reach the possible damage level 202.

As will be understood from the following discussion, in one embodiment, the disclosed amplifier with an output limiter that includes a coupling capacitor and utilizes charge pump technology to create voltages which automatically turn on and off the output shorting circuit. The shorting circuit reflects power when on back to enhance the output of the RF coupling circuit to limit the output power.

Figure 3:
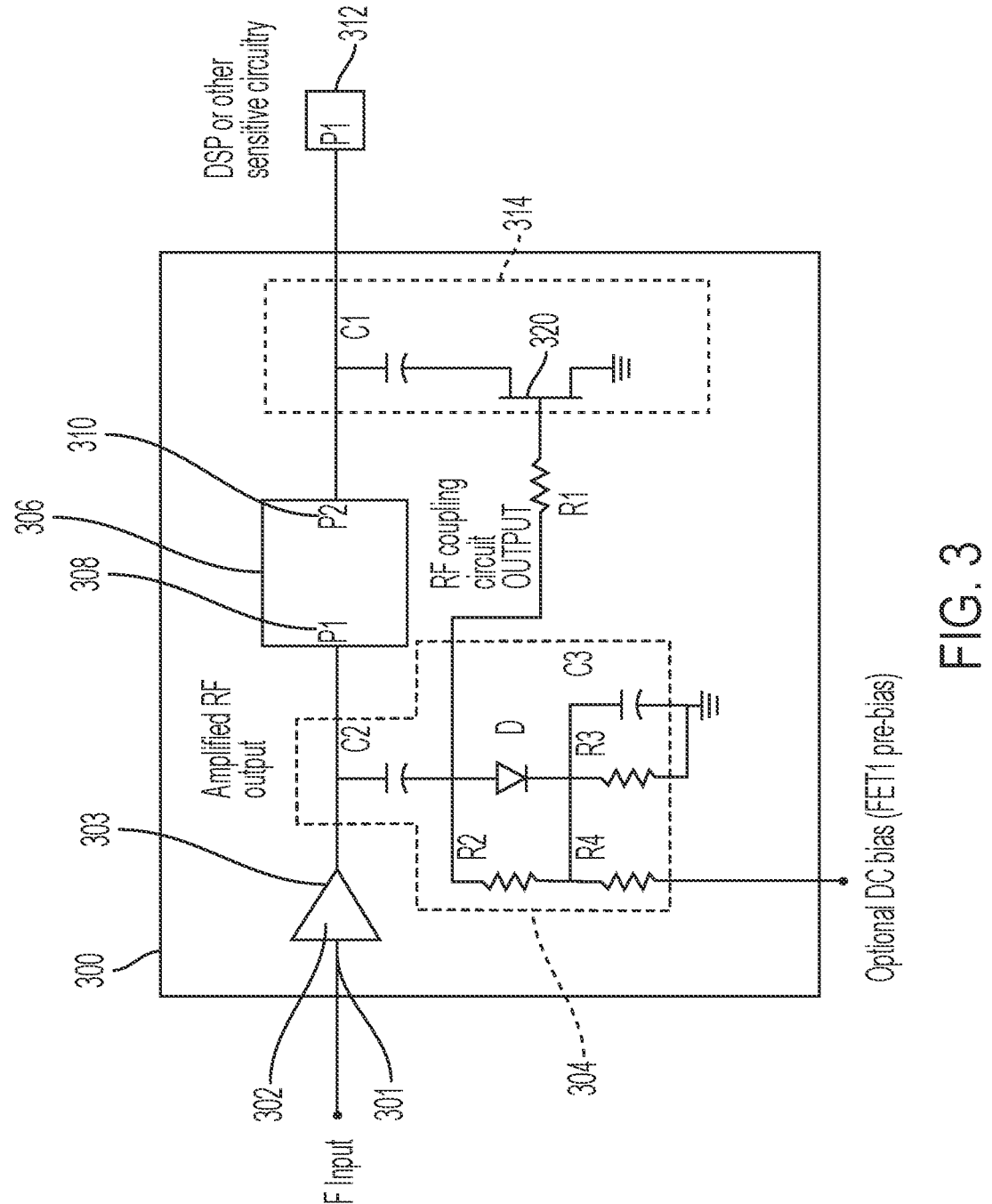
FIG. 3 shows an example of an amplifier that includes an impedance matching section, an RF coupling circuit and an RF shorting circuit, all connected between the amplifier gain stages and an input of the low power circuit.

FIG. 3 shows an example amplifier 300 according to one embodiment. The amplifier 300 includes a gain stage 302 that receives an RF input and a gain stage input 301 and provides an amplified RF output at a gain stage output 303. The gain stage 302 can be any type of amplifier gain stage. Examples include a Gallium-Nitride based amplifier stages and silicon-based amplifier stages.

The amplifier 300 also includes an RF coupling circuit 304. The RF coupling circuit is shown as being arranged in a charge pump configuration and is connected to an output of the gain stage 302. The amplifier 300 also includes an impedance matching circuit 306 connected to the output 303 of the gain stage 302. The impedance matching circuit 306 includes an input 308 and an output 310. As shown, the input 308 is connected directly to the RF coupling circuit 304 but other elements could be provided between them depending on the context.

The amplifier 300 also includes a shorting circuit 314. The shorting circuit 314 is controlled by the RF coupling circuit 304. The shorting circuit 314 as shown in FIG. 3 includes a reflecting capacitor C1 serially connected between the output 310 of the impedance matching circuit 306 output 310 and ground through a shorting transistor 320. As shown, the shorting transistor 320 is implemented as FET but other types of transistors could be utilized. As shown in FIG. 3, when the RF coupling circuit 304 is used to control the gate of the transistor 320 by providing an RF coupling circuit output to the gate of the transistor 320. As charge is accumulated in the RF coupling circuit 304 (and in particular, across storage C3), this creates a positive voltage on the gate of the transistor 320. As will be understood, this will provide a short from the output 310 to ground through the reflecting capacitor C1. The effects of this short are more fully described below.

The impedance matching circuit output 310 can be connected to a low power circuit (e.g., a DSP) 312. The impedance matching circuit 306 can include various elements such as inductors and capacitors as is known in the art to help match the output impedance of the gain stage 302 to the input impedance of the low power circuit 312.

When a short from the output 310 to ground through the reflecting capacitor C1 is created (e.g., the voltage at the gate of the transistor 320 exceeds the turn on voltage of the transistor 320) the capacitor C1 is introduced into the circuit and will create RF reflections. As will be understood, before the voltage at the gate of the transistor 320 exceeds the turn on voltage of the transistor 320 the shorting circuit 314 is basically an open circuit and, thus, the capacitor C1 does not affect the circuit.

As shown, the RF coupling circuit 304 includes a coupling capacitor C2 connected to the output 303 of the gain stage 302. The coupling capacitor C2 is serially connected to ground through a diode D and charge capacitor C3. During operation, the coupling capacitor C2 couples power to the capacitor C3 through diode D.

The amplifier 300 also includes also includes a shorting circuit 314. The RF coupling circuit 304 develops charge across C3 which creates a positive-going voltage that increases with increased RF power. For completeness, various tuning resistors R2, R3, and R4 are also provided. R3 is connected in parallel with C3 and can serve discharge stored voltage in the C3 as the power at the output 303 decreases. R2 is in parallel with diode D. Lastly, an optional resistor R4 can be connected in series with R2 and to ground to that a pre-bias voltage can be provided across C3 and, thus, to the gate of the transistor 320. An optional resistor R1 is shown between the output of the RF coupling circuit 304 and the gate of the transistor 320 to control gate current.

When gate of the transistor 320 is above the turn on voltage, C1 is shorted to ground. This creates an RF reflection that reflects back through the output matching circuit 306 and peaks the RF coupled power. This will serve to increase the voltage at the gate of the transistor 320 and provide for a hard clamp. When RF power is removed, the transistor 320 returns back to the pre-bias state (off-state) and C1 is removed.

In one embodiment, the impedance matching circuit 306 can be designed such that it produces an impedance transformation of the short through C1 into an "open circuit." This can be accomplished, in one embodiment, by using a smith chart to analyze the impedance matching circuit with the circuit including and not including C1 as will be understood by the skilled artisan after reading the above description.

Silicon-based circuits could implement e-fuses in order to set the max output power level by permanently switching in various C2, R3/R4 combinations.

In addition, for semiconductors without fuse options, R3 could be implemented in a multi-tap configuration where multiple resistors could be fabricated and bonded to ground off-chip to set the maximum power level.

Figure 4:
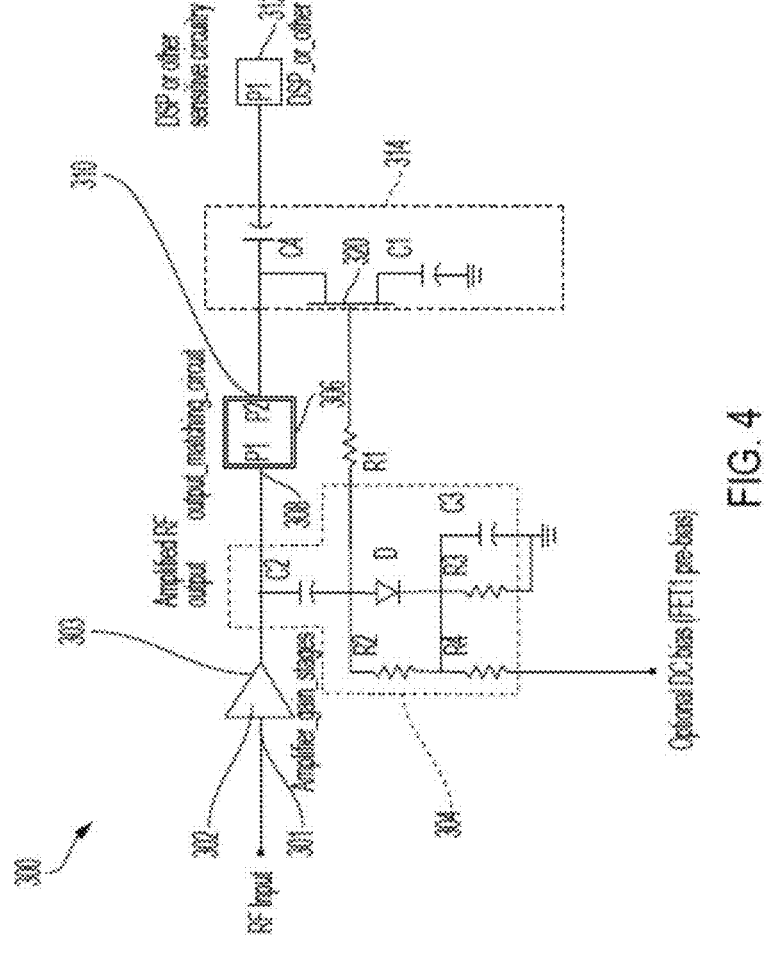
FIG. 4 shows another example of an amplifier that includes an impedance matching section, an RF coupling circuit and an RF shorting circuit, all connected between the amplifier gain stages and an input of the low power circuit.

One possible variation to the amplifier shown above is that the reflecting capacitor C1 may be connected on the ground side of the transistor 320 as shown in FIG. 4. As shown, an optional smoothing capacitor C4 can be added in this embodiment. This provides the option of having the shorting circuit to be DC-biased in a floating configuration (capacitor on the source node) with bias coming from the amplifier output matching circuit.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the embodiments as disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments of the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. An amplifier comprising:
a gain stage having a gain stage input and a gain stage output;
an impedance matching circuit connected to the gain stage output, the impedance matching circuit including an input and an output;
a coupling circuit connected to the input of the impedance matching circuit; and
a shorting circuit connected to the output of the impedance matching circuit;
wherein the coupling circuit provides a voltage to the shorting circuit that causes the shorting circuit to create a short to ground through a reflecting capacitor which causes a reflection to be provided to the output of the impedance matching circuit and that is transmitted to the coupling circuit to increase the voltage provided to the shorting circuit by the coupling circuit.

2. The amplifier of claim 1, wherein the coupling circuit includes a coupling capacitor connected to the gain stage output.

3. The amplifier of claim 2, wherein the coupling circuit includes a storage capacitor connected between the coupling capacitor and ground that stores power coupled from the output of the gain stage output by the coupling capacitor.

4. The amplifier of claim 3, wherein the coupling circuit further comprises a diode connected between the coupling capacitor the storage capacitor such that charge flows from the coupling capacitor to the storage capacitor.

5. The amplifier of claim 4, further comprising a first resistor connected between an output of the coupling circuit and the shorting circuit.

6. The amplifier of claim 4, wherein the shorting circuit includes a transistor having a gate connected to an output of the coupling circuit such that the voltage provided by the shorting circuit controls operation of the transistor.

7. The amplifier of claim 6, wherein the the reflecting capacitor is connected to the transistor and the transistor controls if power is provided to the reflecting capacitor.

8. The amplifier of claim 6, wherein the reflecting capacitor is connected between the output of the impedance matching circuit and the transistor.

9. The amplifier of claim 6, wherein the transistor is connected between the output of the impedance matching circuit and the reflecting capacitor.

10. The amplifier of claim 6, wherein the coupling circuit further includes a second resistor connected in parallel with the diode.

11. The amplifier of claim 6, wherein the coupling circuit further includes a third resistor connected in parallel with the storage capacitor.

12. The amplifier of claim 1, wherein the coupling circuit operates as a charge pump.

13. The amplifier of claim 1, wherein the impedance matching circuit transforms a short circuit created through the reflecting capacitor into an open circuit at the input.

* * * * *